US008661375B2

(12) United States Patent
Wang

(10) Patent No.: US 8,661,375 B2
(45) Date of Patent: Feb. 25, 2014

(54) FREQUENCY DIVISION MULTIPLEXING (FDM) LITHOGRAPHY

(75) Inventor: Yao-Ting Wang, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 386 days.

(21) Appl. No.: 12/970,798

(22) Filed: Dec. 16, 2010

(65) Prior Publication Data

US 2011/0154274 A1 Jun. 23, 2011

Related U.S. Application Data

(62) Division of application No. 10/949,678, filed on Sep. 24, 2004, now Pat. No. 7,879,538.

(60) Provisional application No. 60/505,603, filed on Sep. 24, 2003.

(51) Int. Cl.
 *G06F 17/50* (2006.01)

(52) U.S. Cl.
 USPC .............................. 716/55; 355/18

(58) Field of Classification Search
 USPC .............................. 716/55; 355/18
 See application file for complete search history.

(56) References Cited

U.S. PATENT DOCUMENTS

| | | | |
|---|---|---|---|
| 4,827,428 A | 5/1989 | Dunlop et al. | |
| 4,904,569 A | 2/1990 | Fukuda et al. | |
| 5,293,216 A | 3/1994 | Moslehi | |
| 5,764,532 A | 6/1998 | Patel | |
| 5,974,244 A | 10/1999 | Hayashi et al. | |
| 6,014,505 A | 1/2000 | Schorn | |
| 6,169,968 B1 | 1/2001 | Kabuo | |
| 6,209,121 B1 | 3/2001 | Goto | |
| 6,209,122 B1 | 3/2001 | Jyu et al. | |
| 6,219,631 B1 | 4/2001 | Oh et al. | |
| 6,306,769 B1 | 10/2001 | Subramanian et al. | |
| 6,378,109 B1 | 4/2002 | Young et al. | |
| 6,403,291 B1 | 6/2002 | Kawashima et al. | |
| 6,425,110 B1 | 7/2002 | Hathaway et al. | |
| 6,507,936 B2 | 1/2003 | Yamaguchi | |
| 6,553,338 B1 | 4/2003 | Buch et al. | |
| 6,593,064 B1 | 7/2003 | Gelbart | |
| 6,618,837 B1 | 9/2003 | Zhang et al. | |
| 6,990,651 B2 | 1/2006 | Balasubramanian et al. | |
| 2002/0196629 A1 | 12/2002 | Terashi | |
| 2003/0167451 A1 | 9/2003 | Igarashi | |
| 2003/0229412 A1 | 12/2003 | White et al. | |
| 2004/0010764 A1 | 1/2004 | Zhang et al. | |
| 2004/0052411 A1 | 3/2004 | Qian et al. | |
| 2004/0152011 A1 | 8/2004 | Chen et al. | |
| 2004/0170905 A1 | 9/2004 | Liebmann et al. | |
| 2004/0172609 A1 | 9/2004 | Hassibi et al. | |
| 2004/0210863 A1 | 10/2004 | Culp et al. | |
| 2004/0243964 A1 | 12/2004 | McElvain et al. | |
| 2005/0027501 A1 | 2/2005 | Chen et al. | |
| 2005/0034087 A1 | 2/2005 | Hamlin et al. | |
| 2005/0108666 A1 | 5/2005 | Chang et al. | |
| 2005/0172251 A1 | 8/2005 | Chang et al. | |
| 2006/0015834 A1 | 1/2006 | Amekawa | |

FOREIGN PATENT DOCUMENTS

| | | |
|---|---|---|
| JP | 05198678 A | 8/1993 |
| JP | 06149925 A | 5/1994 |
| JP | 07056976 A | 3/1995 |
| JP | 09006831 A | 1/1997 |
| JP | 2003076737 A | 3/2003 |

OTHER PUBLICATIONS

Acar et al., "A Linear-Centric Simulation Framework for Parametric Fluctuations", 2002 Proceedings of Design, Automation and Test in Europe Conference and Exhibition, IEEE Computer Society, Mar. 4, 2002, pp. 1-8.
Anne et al., "Comparitive Analysis of New CMOS Leaf Cells for OTC Routing", IEEE International Symposium on Circuits and Systems, May 30, 1994, vol. 4, pp. 191-194.
Dai et al., "Timing Analysis Taking into Account Interconnect Process Variation", IEEE International Workshop on Statistical Methodology, Jun. 10, 2001, pp. 51-53.
Xue et al., "A Sensitivity-Based Wiresizing Approach to Interconnect Optimization of Lossy Transmission Line Topologies", 1996 IEEE Multi-Chip Module Conference, Feb. 6, 1996, pp. 117-122.

*Primary Examiner* — Daborah Chacko Davis
(74) *Attorney, Agent, or Firm* — Kenyon & Kenyon LLP

(57) ABSTRACT

Systems and methods for generating an image are provided. These systems and methods include generating multiple light beams from a light source by controlling at least one parameter of the light source to be different among each of the multiple light beams. The systems and methods further include forming multiple light patterns of circuit structures that are separated in frequency by directing each of the light beams at a mask of circuit features. The systems and methods, when used in lithography for example, further include directing each of the light patterns toward a silicon substrate. The silicon substrate includes a silicon wafer having a surface at least partially covered with at least one of a photoresist material and a reversible contrast enhancement material (R-CEM).

17 Claims, 10 Drawing Sheets

FREQUENCY DIVISION MULTIPLEXING (FDM) LITHOGRAPHY

RELATED APPLICATION

This application is a divisional of and claims the benefit of U.S. patent application Ser. No. 10/949,678 filed Sep. 24, 2004, now issued as U.S. Pat. No. 7,879,538, which claims the benefit of U.S. Provisional Patent Application, No. 60/505,603, filed Sep. 24 2003, each of which is hereby incorporated herein in its respective entirety.

TECHNICAL FIELD

The disclosure herein relates generally to photon lithography. In particular, this disclosure relates to systems and methods for manufacturing integrated circuit devices or chips using photon lithography.

BACKGROUND

Lithography involves the transfer of a specific pattern onto a surface, and can be used to transfer a variety of patterns onto many types of materials. In particular, lithography is a process currently used to make integrated circuits ("ICs") or computer chips. FIG. 9 is a block diagram of an example lithography system 900 for use in manufacturing computer chips under the prior art. The lithography process defines a pattern specifying the location of electrical circuits of the computer chips like metal, insulators, doped regions, and other features of a circuit printed on a silicon substrate (also referred to as a "wafer") or other substrate. This pattern or stencil is also referred to as a mask. Computer chip manufacturers currently produce ICs by shining light 910 from an illumination source 902 through the mask 906 of the circuit design. The light is then passed through a system of optical lenses 908 to reduce the size of the image, and projected onto a wafer 972 covered by a photosensitive resist 974, also referred to as photoresist 974. The system of optical lenses 908 properly collimates the light for better feature resolution.

The mask 906 allows incident light 910 to pass through areas that define the circuit features but not through other areas. In a manner analogous to that in which light projected through a photographic negative exposes photographic paper, light coming through the mask 906 exposes the photoresist 974. Following transfer of the mask onto the photoresist 974, chemicals are used to wash away the exposed areas of the photoresist 974, leaving the pattern of the mask on the wafer. The exposed photoresist bearing the pattern of the mask selectively resists a further process (e.g., etching with acid, bombardment with various particles, deposition of a metallic or other layer, etc.). Thus, lithography can be used to effectively translate the pattern of circuit features defined by the mask 906 into a structural pattern on the wafer 972. By repeating this technique several times on the same wafer using different masks, it is possible to build multi-layered semiconductor structures and associated interconnecting electrical circuits.

Improvements in lithography have played a part in the explosive growth of the semiconductor industry and likewise the computer industry. One major improvement in lithography includes improvements in resolution resulting in a decrease in the minimum feature size (circuit features) that can be transferred to the wafer. This improvement allows for an increase in the number of transistors that can be placed on a single chip (and in the speed at which these transistors can operate). However, in spite of improvements, problems remain, with lithography in the area of feature resolution on the wafer. While typical lithography techniques that use multiple exposures of multiple masks allow for an increase in circuit feature resolution, the small feature size of the circuits being transferred to the wafer makes proper alignment of the multiple masks difficult. Consequently, there is a need for lithography techniques that provide improved feature resolution without the use of multiple masks.

BRIEF DESCRIPTION OF THE DRAWINGS

In the drawings, the same reference numbers identify identical or substantially similar elements or acts. To easily identify the discussion of any particular element or act, the most significant digit or digits in a reference number refer to the Figure number in which that element is first introduced (e.g., element 106 is first introduced and discussed with respect to FIG. 1).

DETAILED DESCRIPTION

Figure 1:
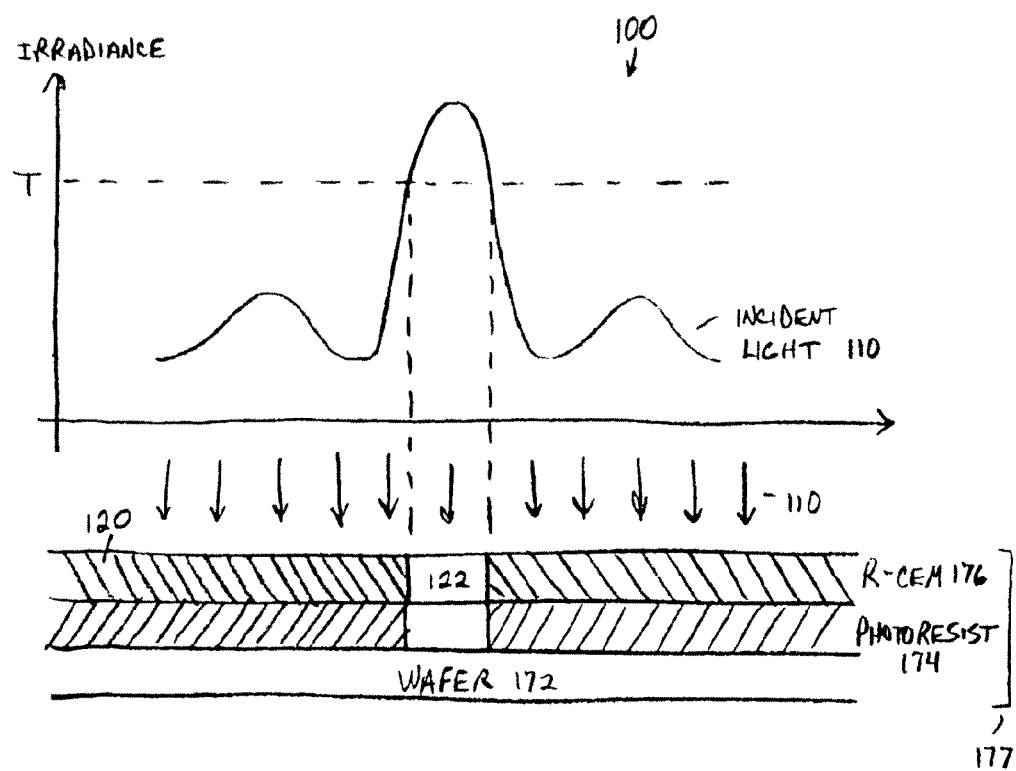
FIG. 1 shows a lithography process using a contrast enhancement material ("CEM"), under an embodiment.

Systems and methods for generating an image are provided. The image may be used in lithography processes, for example, to form various components of electrical circuits in a device fabrication process, but is not so limited. These systems and methods, also referred to herein as Frequency Division Multiplexing ("FDM") lithography, include generating multiple electromagnetic waves or light beams from an electromagnetic energy source by controlling at least one parameter of the energy source to be different among each of the multiple electromagnetic waves. Examples of the parameters controlled include at least one of polarization, frequency, phase, modulation, irradiance, illumination axis, focus position, exposure time, and exposure dosage. The systems and methods further include directing each of the electromagnetic waves at a mask that includes circuit features.

Illumination of the mask with the electromagnetic waves results in formation of multiple light patterns where the light patterns include the circuit features of the mask separated in frequency, where the frequency separation includes spatial frequency. The systems and methods, when used in lithography, further include directing each of the light patterns toward a substrate. The substrate may include a silicon wafer having a surface at least partially covered with at least one of a photoresist material and a reversible contrast enhancement material (R-CEM). The R-CEM generally includes any material or composition that is memory-less/reversible so as to temporarily become transparent in response to incident light having an irradiance that exceeds a pre-specified threshold value while recovering its original properties and returning to an original opaque state upon removal of the incident light. The R-CEM may be present on the substrate in any number of combinations with other materials and in any number/combination of material layers and/or regions of the substrate.

In the following description, numerous specific details are introduced to provide a thorough understanding of, and enabling description for, embodiments of the FDM lithography. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments of the FDM lithography.

Contrast enhancement is a lithography technique which extends the practical limits of optical lithography systems. Contrast enhancement, through the use of a contrast enhancement material ("CEM") coated on the photoresist material, generally provides for improvements in resolution, depth of focus and reduced interference of a given photoresist system. Therefore, the use of CEM in lithography allows for the fabrication of new and denser integrated circuits.

The CEM is a photo-bleachable solution, which is initially opaque to the exposure wavelengths of an illumination source but becomes nearly transparent upon exposure. The properties of the CEM are such that it is memory-less and only becomes transparent, and therefore only bleaches, in areas of the substrate where the incident light irradiance of the lithography process exceeds a threshold value T. In areas of the substrate where the incident light irradiance is below threshold value T the CEM does not bleach. The CEM is said to be reversible in that the material can recover its original properties and return to the original opaque state upon removal of the incident light. The threshold value T of the CEM material is controlled by the choice of the CEM material composition as well as the thickness of the CEM material applied on the photoresist layer, in addition to other properties of the CEM material as known in the art.

FIG. 1 shows a lithography process 100 using a CEM, under an embodiment. In this process, a photoresist material 174 is applied to a surface of a wafer 172 (also referred to herein as a silicon device 172 or silicon wafer 172) and the CEM 176 is applied to or coated over the photoresist material 174. The wafer 172 including the photoresist 174 and the CEM 176 is collectively referred to herein as the substrate 177 or silicon substrate 177. The CEM 176 as applied to the photoresist material is referred to herein as a reversible contrast enhancement material ("R-CEM") 176, but is not so limited. Application of the CEM as the R-CEM 176 includes the use of any number of techniques known in the art including but not limited to spinning, spraying, rinsing, dipping, and evaporating or depositing by thin film growth techniques.

During the photolithography process incident light 110 from a light source illuminates the R-CEM 176 through a mask (not shown) as appropriate to the circuit features of the mask. The incident light 110 includes but is not limited to electromagnetic energy or light having a wavelength that is in a spectrum that extends from approximately an ultraviolet region to an infrared region of the electromagnetic spectrum. The properties of the R-CEM 176 are such that it remains opaque in areas 120 where the irradiance of the incident light as projected through the mask is less than a threshold value T of the R-CEM 176. However, the R-CEM 176 becomes transparent in areas 122 where the incident light irradiance exceeds threshold value T, thereby allowing for transfer of circuit features of the mask to the wafer 172 in these areas 122. Because the R-CEM 176 is memory-less/reversible, the R-CEM 176 recovers to the original opaque state upon removal of the incident light 110.

In this process, for example, the incident light HO bleaches through the R-CEM 176 to the photoresist 174 only in the area 122 where the irradiance of the incident light as projected through the mask exceeds the threshold value T of the R-CEM 176. In other areas 120 of the R-CEM 176 that correspond to portions of the Airy pattern of the incident light 110 where the irradiance of the incident light is less than threshold T, however, the photoresist 174 is filtered from exposure to the incident light 110 by the R-CEM 176. This is because the physical properties of the R-CEM 176 cause the R-CEM 176 to act as a filter to block exposure of the photoresist 174 to unwanted light or light that is below the irradiance threshold T of the R-CEM 176. Thus, the R-CEM 176 can be used to block interference between different exposures of the photoresist during lithography processes involving multiple exposures of the substrate 177. As multiple exposures of the substrate 177 result in higher resolution of transferred mask features, the R-CEM 176 can improve the results of the lithography process by facilitating multiplexing of mask features through a variety of multiplexing lithography processes as described below.

Figure 2:
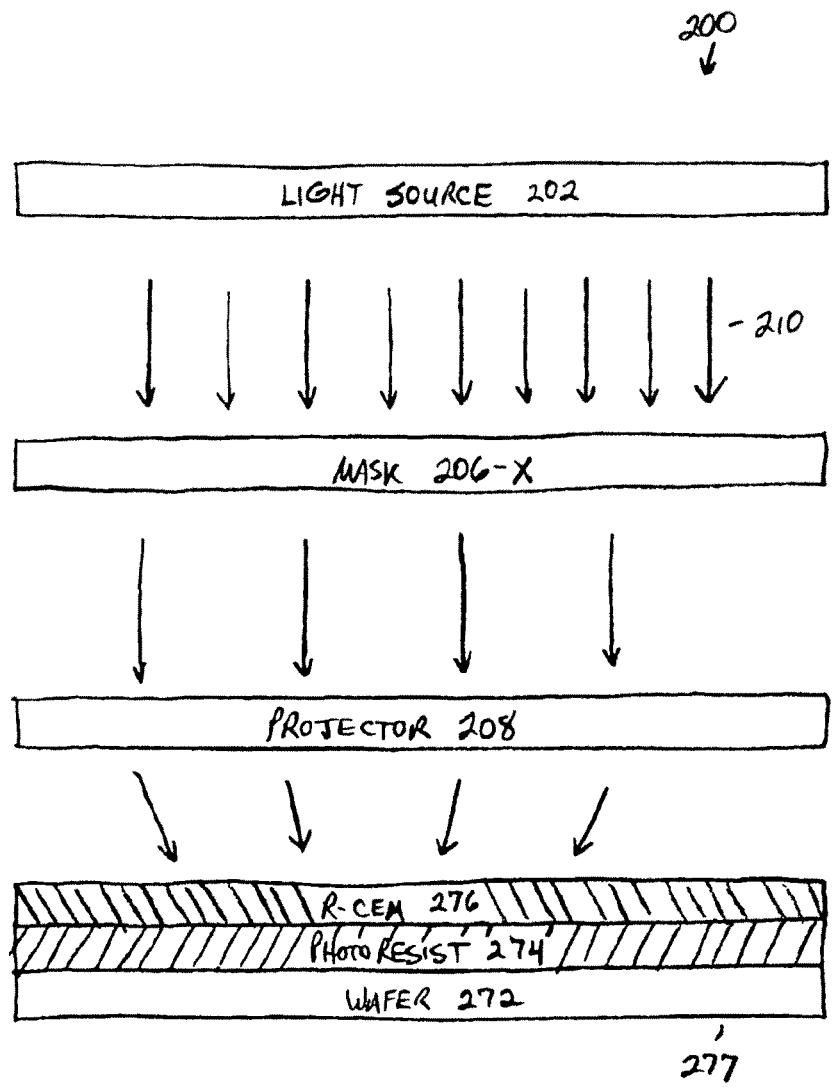
FIG. 2 is a block diagram of a Space Division Multiplexing ("SDM") lithography system, under an embodiment.

FIG. 2 is a block diagram of a Space Division Multiplexing ("SDM") lithography system 200, under an embodiment. The SDM lithography system 200 of an embodiment includes an energy or light source 202 that delivers electromagnetic energy in the form of light 210 to illuminate a pre-specified number of masks 206-X, where X is 1 . . . N as described below. Each of the masks 206-X of an embodiment is configured for use in SDM lithography processes as described below. Light 210 passes through the masks 206-X and forms an image at a projector 208 or optical lens system 208. The projector 208 collimates or otherwise manipulates the received image during each exposure as appropriate for better feature resolution, and projects the collimated image onto a substrate 277. Upon completion of the pre-specified number of exposures that comprise the SDM lithography process all features of the mask will have been projected onto the substrate 277. The SDM lithography process uses a silicon substrate 277 that includes a photoresist 274 applied to a wafer 272 or other silicon device/substrate, with the R-CEM 276 applied to the photoresist 274, as described above with reference to FIG. 1, but is not so limited. Alternative embodiments, however, may use different combinations/applications of the photoresist and R-CEM applied to a wafer.

Figure 3:
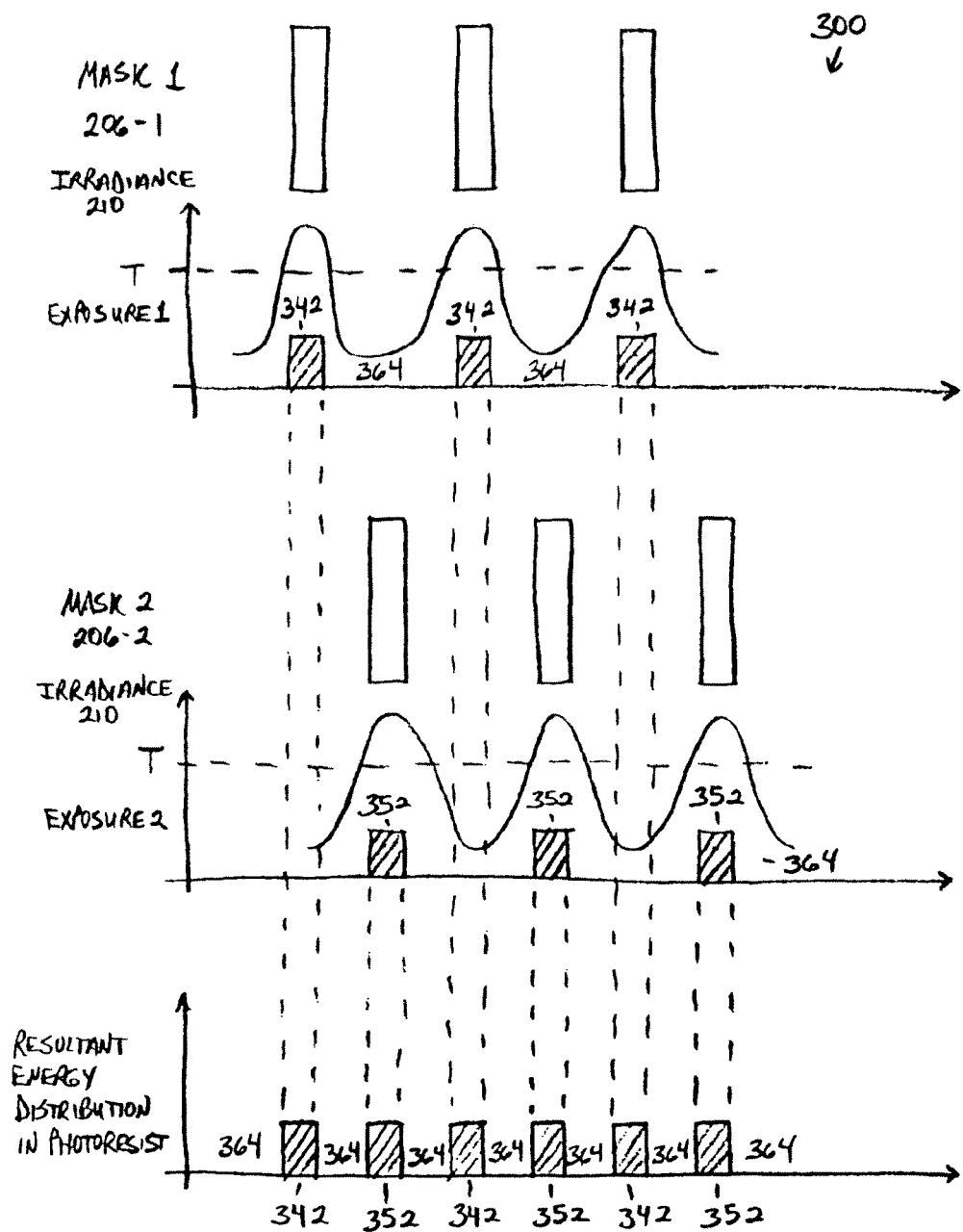
FIG. 3 shows energy distribution in a photoresist material resulting from an example SDM lithography process using a substrate coated with a CEM to form a reversible contrast enhancement material ("R-CEM"), under an embodiment.

FIG. 3 shows energy distribution 300 in a photoresist material resulting from an example SDM lithography process using a substrate coated with R-CEM, under an embodiment. Generally the SDM lithography process, also referred to herein as SDM lithography, multiplexes various circuit features of an original mask through the use of multiple exposures of a wafer using multiple masks. More specifically the SDM lithography multiplexes the circuit features or pattern of the original mask through which the substrate is illuminated by dividing the circuit features of the original mask among a number "N" of separate masks in the spatial domain. Each of the N masks therefore includes one or more features of the original mask, and the set of N masks collectively includes all features of the original mask. The division of features of the original mask in the spatial domain may be based on feature size, feature shape, feature dimensions, feature geometry, mask size, mask, shape, mask geometry, and physical proximity of the features, to name a few, but is not so limited. The SDM lithography then uses incident light from a light source to expose the substrate N times, where each exposure uses a different one of the N masks. Upon completion of the SDM lithography, the substrate has been exposed N times where each exposure used a different one of the N masks.

With reference to FIG. 2 and FIG. 3, an example of SDM lithography is described. This SDM lithography example shows the irradiance 210 of a substrate 277 that includes an R-CEM 276 and the resultant energy distribution 342/352 in the photoresist 274 of the substrate 277 for a process that includes two (2) exposures of the substrate 277 using two (2) masks; the SDM lithography however is not limited to any particular number of exposures and/or masks. The SDM lithography of this example begins by dividing the circuit features of an original mask in the spatial domain in order to form a first mask 206-1 and a second mask 206-2.

Following formation of the first 206-1 and second 206-2 masks, the first mask 206-1 is selected for use during a first exposure EXPOSURE1. Incident light 210 from a light source illuminates the R-CEM 276 through the first mask 206-1 during the first exposure EXPOSURE1. The incident light 210 includes but is not limited to light or electromagnetic energy with a wavelength that is in a spectrum that extends from approximately an ultraviolet region to an infrared region of the electromagnetic spectrum. The properties of the R-CEM 276 are such that it becomes transparent in areas 342 where the incident light irradiance through the first mask 206-1 exceeds the pre-specified threshold value T of the R-CEM 276, thereby allowing for transfer of features of the first mask 206-1 to the photoresist 274 in these areas 342. The properties of the R-CEM 276 also cause it to remain opaque in areas 364 where the irradiance of the incident light 210 as projected through the first mask 206-1 is less than the threshold value T. Therefore, in the areas 364 where the irradiance of the incident light is less than threshold T the photoresist 274 of the substrate 277 is filtered from exposure to the light by the R-CEM 276; because the R-CEM 276 is memory-less/reversible, the R-CEM 276 recovers to the original opaque state upon removal of the incident light.

Following exposure of the first mask 206-1, the second mask 206-2 is selected for use during a second exposure EXPOSURE2. Incident light 210 from a light source illuminates the R-CEM 276 through the second mask 206-2 during the second exposure EXPOSURE2. The properties of the R-CEM 276 are such that it becomes transparent in areas 352 where the incident light irradiance through the second mask 206-2 exceeds the threshold value T of the R-CEM 276, thereby allowing for transfer of features of the second mask 206-2 to the photoresist 274 in these areas 352. As in the first exposure, the properties of the R-CEM 276 also cause it to remain opaque in areas 364 where the irradiance of the incident light 210 as projected through the second mask 206-2 is less than the threshold value T. Therefore, in the areas 364 where the irradiance of the incident light 210 is less than threshold T the photoresist 274 of the substrate 277 is filtered from exposure to the light by the R-CEM 276; because the R-CEM 276 is memory-less/reversible, the R-CEM 276 recovers to the original opaque state upon removal of the incident light. Following the second exposure EXPOSURE2 of the substrate 277, the resultant energy distribution in the photoresist 274 corresponds to the transferred circuit features of both the first and second masks 206-1/206-2.

While use of the CEM as an R-CEM allows for multiple exposures of a subs ate or photoresist using multiple masks, use of the R-CEM also allows for alternative lithography processes that include multiple exposures of a substrate or photoresist using a single mask. As another example of use of the R-CEM to block interference between different exposures of the substrate or photoresist during lithography, a frequency division multiplexing ("FDM") lithography process of an embodiment includes multiple exposures of a single mask. In contrast to SDM lithography, the FDM lithography divides the original mask features in the frequency domain by using different illumination schemes for each exposure of the mask, as described below.

Figure 4:
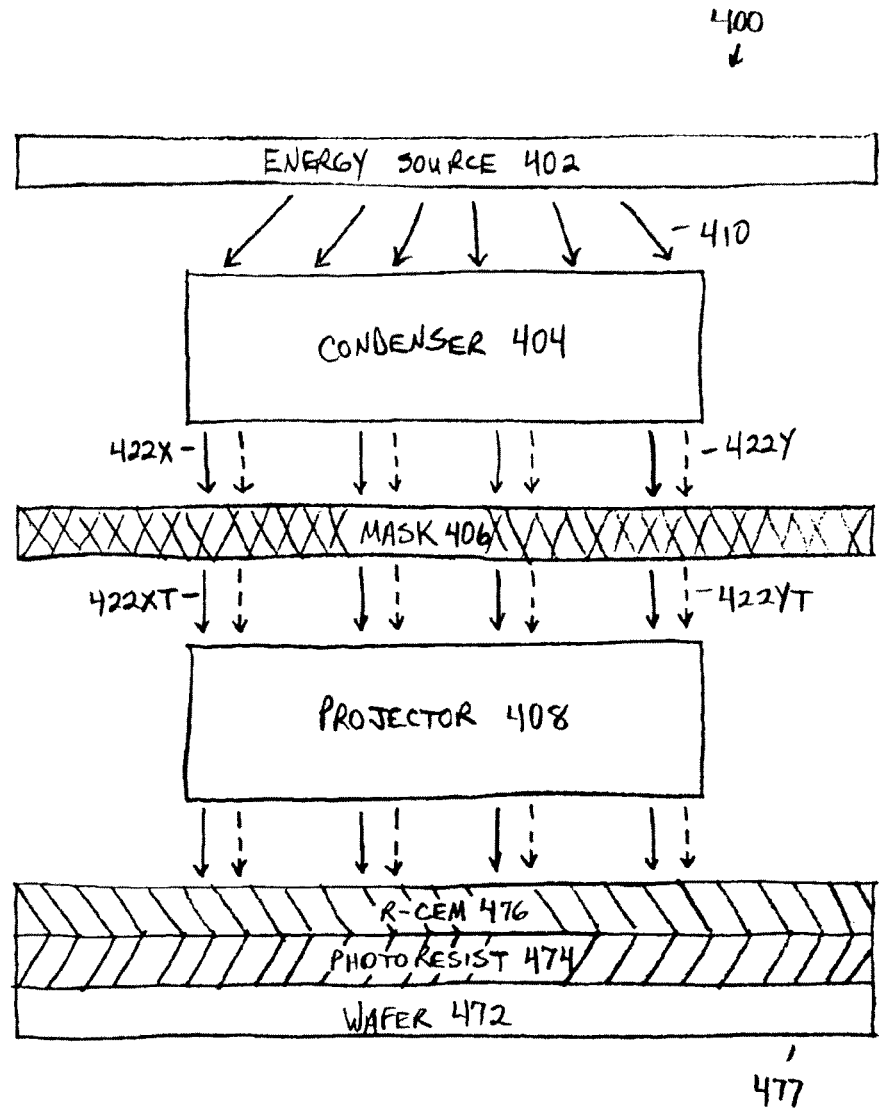
FIG. 4 is a block diagram of a Frequency Division Multiplexing ("FDM") lithography system, under an embodiment.

As an example of FDM lithography, FIG. 4 is a block diagram of an FDM lithography system 400, under an embodiment. The FDM lithography system 400 multiplexes various features of a single mask through the use of multiple light beams or electromagnetic waves for each of a number of different exposures. Each of the multiple light beams includes at least one property or parameter that is different or varied from that of the other light beams. As each of the multiple light beams of the FDM lithography system 400 illuminate mask features having different frequency components, the FDM lithography system 400 can be said to use different properties of light to divide the mask features in the frequency domain. In providing the different light beams or electromagnetic waves for each exposure the FDM lithography system 400 controls various properties of the light, where the properties include at least one of polarization, frequency, phase, modulation, irradiance, illumination axis, focus position, and exposure dosage, but the embodiment is not so limited.

The FDM lithography system 400 of an embodiment includes an electromagnetic energy source 402 that delivers electromagnetic energy in the form of light 410 to a condenser 404. The condenser 404 receives the light 410 from the light source 402 and in turn controls the parameters of the light 410 in order to illuminate the mask 406 with multiple light beams 422X/422Y (also referred to herein as electromagnetic waves 422X/422Y) having pre-specified parameters (while he multiple light beams are represented herein by two different light beams 422X/422Y for clarity, FDM lithography is not limited to two different light beams). Thus, the condenser 404 controls at least one of the polarization, frequency, phase, modulation, irradiance, illumination axis, focus position, exposure time, and exposure dosage of the light 410 received from the light source 402 in order to provide multiple light beams 422X/422Y having pre-specified properties during a particular exposure of the substrate 477 as appropriate to the exposure and the lithography process. The mask 406 of an embodiment is configured in accordance with the multiple light beams 422X/422Y with which the mask is illuminated so that the appropriate mask features are projected onto the substrate when the mask is illuminated with alight beam having the corresponding properties.

Light passing through the mask 406 forms an image at a projector 408 or optical lens system 408. The projector 408 collimates the received image during each exposure for better feature resolution, and projects the collimated image onto the substrate 477. Upon completion of the pre-specified number of exposures that comprise the FDM lithography process all features of the mask will have been projected onto the substrate 477. The FDM lithography uses a substrate 477 that includes a photoresist 474 applied to a silicon device or wafer 472, with the R-CEM 476 applied to the photoresist 474, as described above with reference to FIG. 1. Alternative embodiments, however, may use different combinations/applications of the photoresist and R-CEM applied to the substrate.

The FDM lithography system 400 may control various parameters of the light, as described above. The parameters may include polarization, frequency, phase, modulation, irradiance, illumination axis, focus position, and exposure dosage, but the parameters are not so limited. One example of an FDM lithography process of an embodiment includes controlling the polarization properties of the light 410 received from the light source 402 so as to illuminate the mask 406 with light having a different polarization during each of a pre-specified number of exposures. This example however, does not limit FDM lithography to the control of polarization properties.

Figure 5A:
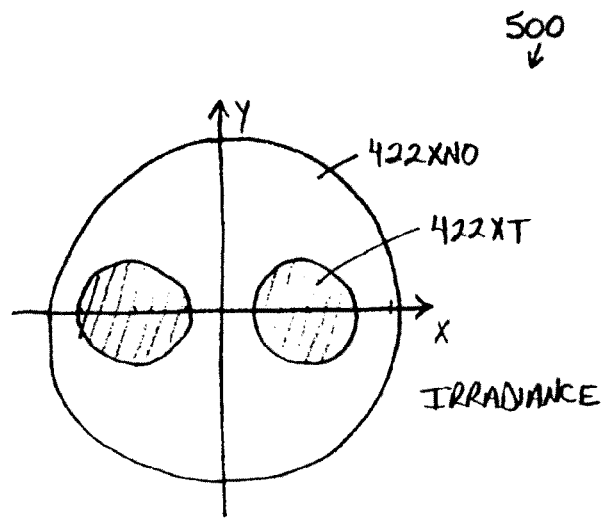
FIGS. 5A and 5B show energy distribution in a photoresist material resulting from an example FDM lithography process using polarized light and a substrate coated with R-CEM, under an embodiment.
Figure 5A:
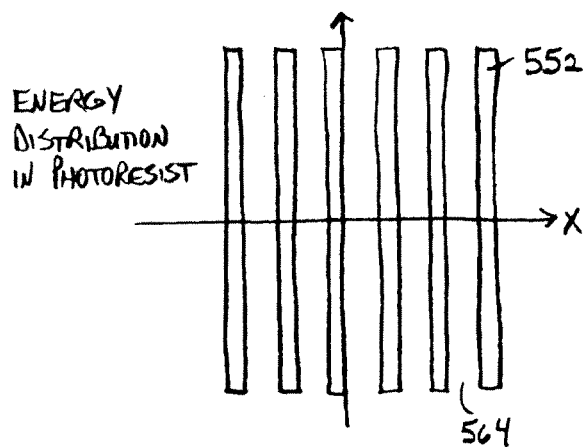
Figure 5B:
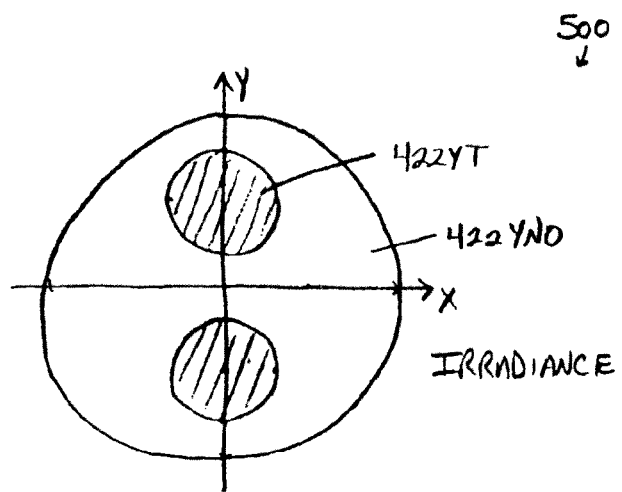
Figure 5B:
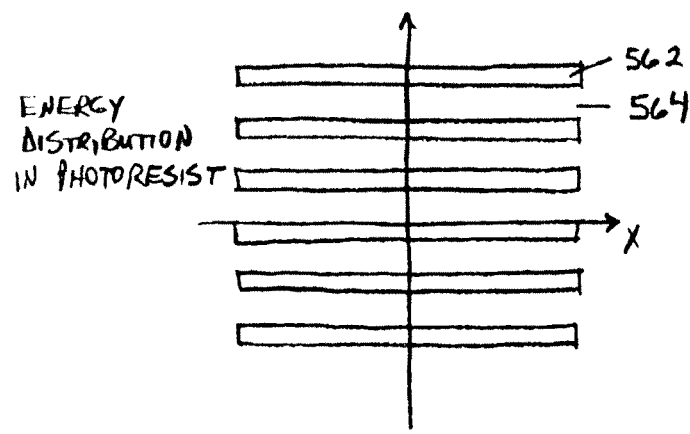

In an example FDM lithography system that controls the polarity parameter between multiple light beams, an image is projected through a mask during each of two exposures. A first exposure uses light beams having a first polarization and a second exposure uses light beams having a second polarization. The mask is configured for projection of different sets of components of the mask during each exposure in accordance with the light polarization of that exposure. The FDM lithography however is not limited to any particular number of exposures or to control of only polarization. FIGS. 5A and 5B show energy distribution 500 in a photoresist material resulting from an example FDM lithography process using polarized light and a substrate coated with R-CEM, under an embodiment.

With reference to FIGS. 4, 5A, and 5B, light 410 from the light source 402 is received at the condenser 404. During a first exposure, the condenser 404 controls the polarization of the received light 410 to provide light beams 422X polarized in the x-plane, for example. From the condenser, the polarized light beams 422X pass through the mask 406 as light beams 422XT in areas where the polarization of the light beams 422X is approximately the same as the polarization the mask substrate is configured to pass, and is scattered of absorbed by the Mask in all other areas. Therefore, for example, the x-plane polarized light 422XT transmitted through the mask projects features of an x-grating of the mask 406 or mask substrate. The projector 408 receives the resultant light beams 422XT, collimates the image, and projects the collimated image including features of the mask x-grating onto the substrate 477 during the first exposure.

In this example, light beams 422XT transmitted through the mask during an exposure will have an irradiance that exceeds the threshold value T of the R-CEM of the substrate 477 only in the areas of the mask where the polarization of the light matches the polarization configuration of the mask substrate. Consequently, with reference to FIG. 5A, areas of the mask x-grating pass x-plane polarized light 422XT having an irradiance exceeding the pre-specified threshold value of the R-CEM. In contrast, any light beams 422XNO passed by the mask through areas outside the mask x-grating have an irradiance that is less than the threshold value of the R-CEM as a result of the polarity differences between the light beams 422X and the mask substrate 406.

Turning to the substrate 477, the properties of the R-CEM 476 are such that it becomes transparent in areas 552 of the R-CEM 476 corresponding to the projected mask x-grating because these are the areas 552 of the R-CEM 476 in which the light irradiance exceeds the threshold value of the R-CEM 476. The result is the transfer of mask features of the mask x-grating to the photoresist 474 of the substrate 477 in the are 552 of the photoresist 474 corresponding to the areas of the projected mask x-grating.

As described above, the properties of the R-CEM 476 cause it to remain opaque in areas corresponding to areas 564 outside the projected mask x-grating because the irradiance of the incident light is less than the threshold value of the R-CEM 476 in these areas. Thus, the photoresist 474 is filtered from exposure to the light by the R-CEM 476 in the areas corresponding to mask areas 564 external to the mask x-gating.

Continuing the example, during a second exposure, the condenser 404 controls the polarization of the received light 410 to provide light beams 422Y polarized in the y-plane, for example. From the condenser, the polarized light beams 422Y pass through the mask 406 as light beams 422YT in areas where the polarization of the light beams 422Y is approximately the same as the polarization the mask substrate is configured to pass, and is scattered or absorbed by the mask in all other areas. Therefore, for example, the y-plane polarized light 422YT transmitted through the mask projects features of a y-grating of the mask 406 or mask substrate. The projector 408 receives the resultant light beams 422YT, collimates the image, and projects the collimated image including features of the mask x-grating onto the substrate 477 during the first exposure.

In this example, light beams 422YT transmitted through the mask during an exposure will have an irradiance that exceeds the threshold value T of the R-CEM of the substrate 477 only in the areas of the mask where the polarization of the light matches the polarization configuration of the mask substrate. Consequently, with reference to FIG. 5B, areas of the mask y-grating pass y-plane polarized light 422YT having an irradiance exceeding the pre-specified threshold value of the R-CEM. In contrast, any light beams 422YNO passed by the mask through areas outside the mask y-grating have an irradiance that is less than the threshold value of the R-CEM as a result of the polarity differences between the light beams 422Y and the mask substrate 406.

Turning to the substrate 477, the properties of the R-CEM 476 are such that it becomes transparent in areas 562 of the R-CEM 476 corresponding to the projected mask y-grating because these are the areas 562 of the R-CEM 476 in which the light irradiance exceeds the threshold value of the R-CEM 476. The result is the transfer of mask features of the mask y-grating to the photoresist 474 of the substrate 477 in the areas 562 of the photoresist 474 corresponding to the areas of the projected mask y-grating.

As described above, the properties of the R-CEM 476 cause it to remain opaque in areas corresponding to areas 564 outside the projected mask y-grating because the irradiance of the incident light is less than the threshold value of the R-CEM 476 in these areas. Thus, the photoresist 474 is filtered from exposure to the light by the R-CEM 476 in the areas corresponding to mask areas 564 external to the mask x-grating.

Figure 6:
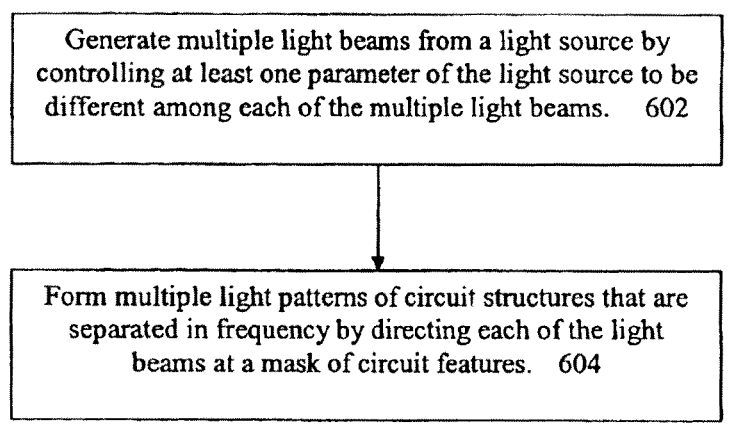
FIG. 6 is a flow diagram for generating an image, under an embodiment.

In further describing image generation, for use in FDM lithography for example, FIG. 6 is a flow diagram 600 for generating an image, under an embodiment. Components of a lithography system, for example, generate multiple light beams from a light source by controlling at least one parameter of the light source to be different among each of the multiple light beams, at block 602. The components form multiple light patterns of circuit structures that are separated in frequency by directing each of the light beams at a mask of circuit features, at block 604.

Figure 7:
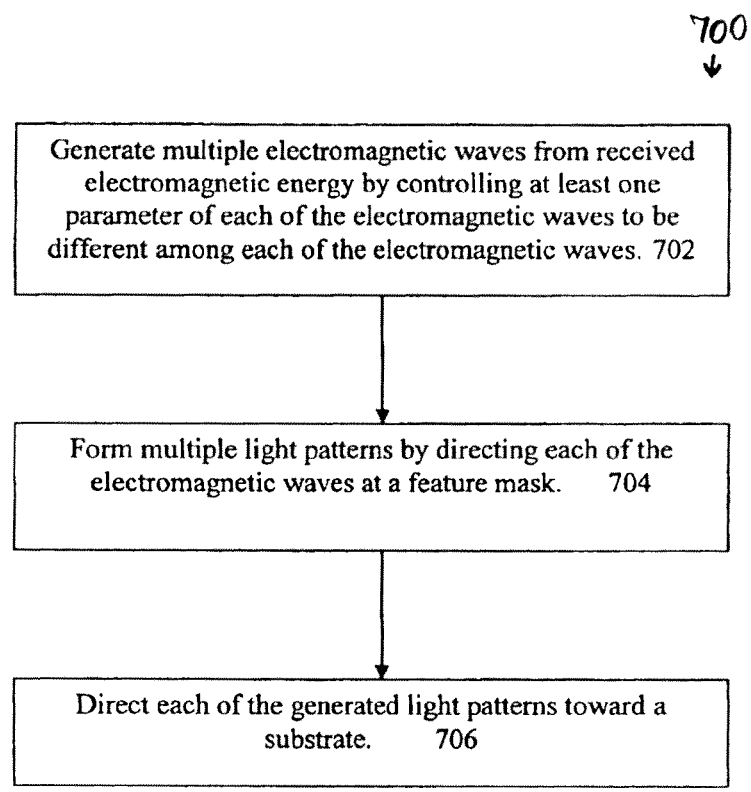
FIG. 7 is a flow diagram for producing an image in a photoresist material, under an embodiment.

In further describing image generation using FDM lithography, for use in semiconductor design and/or manufacturing for example, FIG. 7 is a flow diagram 700 for producing an image in a photoresist material, under an embodiment. Components of a lithography system, for example, generate multiple electromagnetic waves from received electromagnetic energy by controlling at least one parameter of each of the electromagnetic waves to be different among each of the electromagnetic waves, at block 702. The components form multiple light patterns by directing each of the electromagnetic waves at a feature mask, at block 704. Each of the generated light patterns is directed toward a substrate, at block 706. A surface of the substrate is at least partially covered with the photoresist material and an R-CEM.

As described above, the SDM lithography provides multiplexing of mask features in the spatial domain through the use of multiple masks with an exposure of each mask using a typical light beam or electromagnetic wave. In contrast, the FDM lithography provides multiplexing of mask features in the frequency domain through the use of a single mask which is exposed multiple times where each exposure is made using light beams having different properties from the light beams of other exposures. As another example of use of the R-CEM to block interference between different exposures of the substrate or photoresist during lithography, a hybrid lithography system/process is provided, referred to herein as FDM/SDM lithography, which includes use of multiple masks like the SDM lithography. Furthermore, the hybrid FDM/SDM lithography exposes each mask multiple times as in the FDM lithography described above. The FDM/SDM lithography uses a silicon substrate that includes a photoresist applied to a wafer, with an R-CEM applied to the photoresist, as described above with reference to FIG. 1, but is not so limited. Alternative embodiments, however, may use different combinations/applications of the photoresist and R-CEM applied to the wafer.

Figure 8:
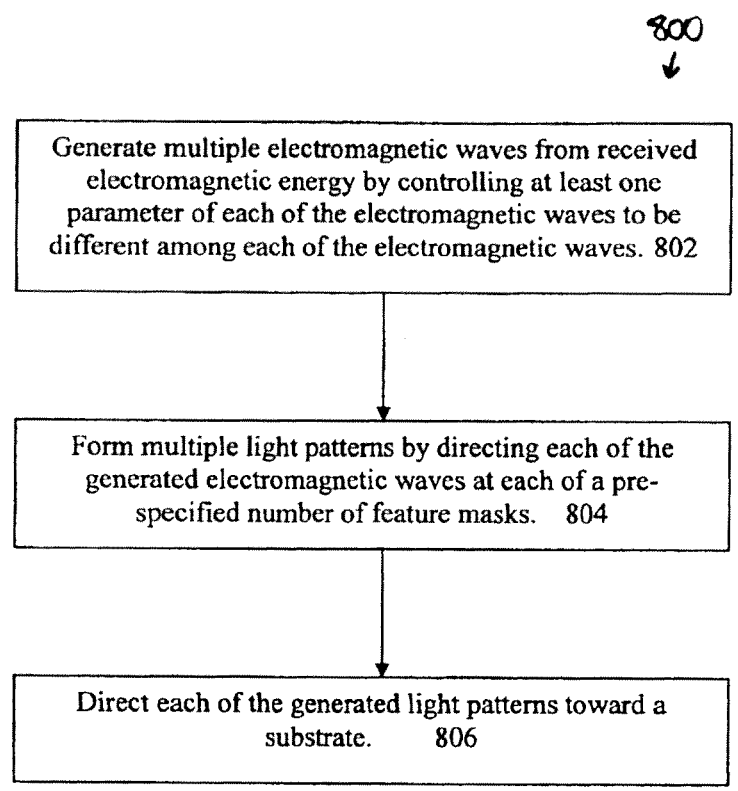
FIG. 8 is a flow diagram for FDM/SDM lithography, under an embodiment.
Figure 9:
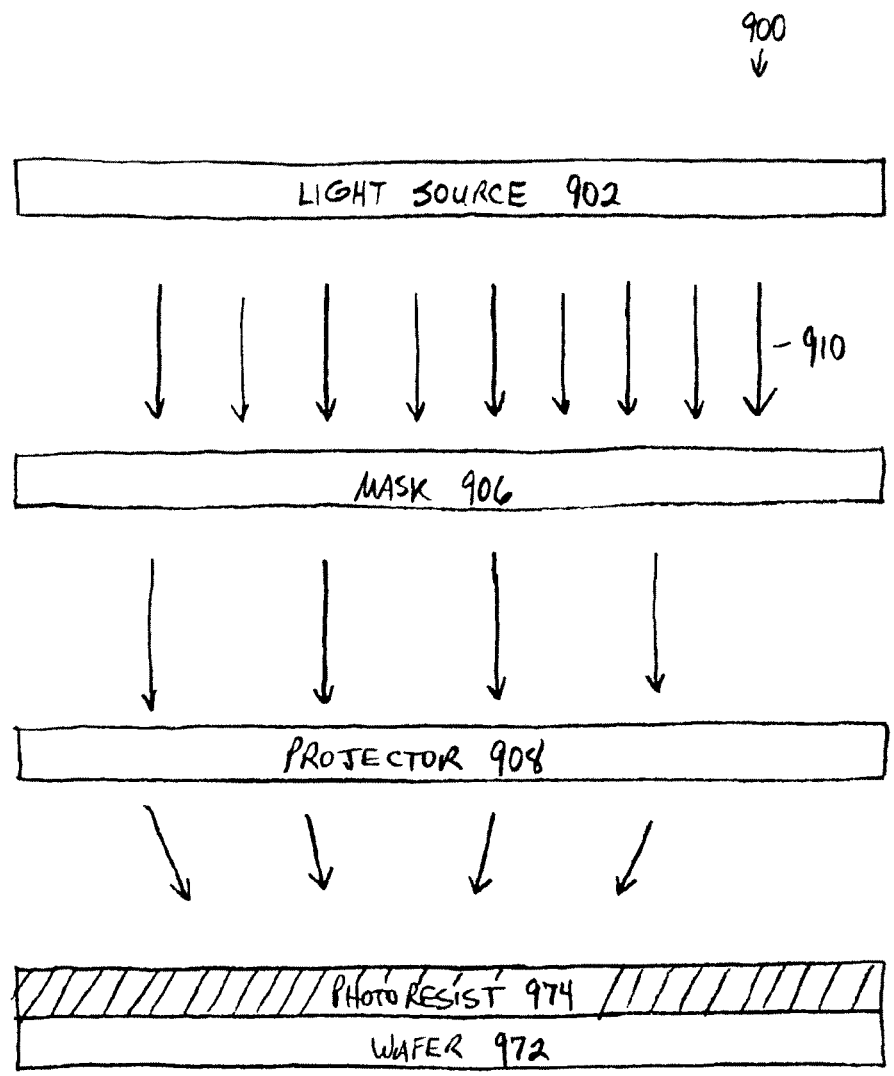
FIG. 9 is a block diagram of an example lithography system for use in manufacturing computer chips under the prior art.

FIG. 8 is a flow diagram 800 for FDM/SDM lithography, under an embodiment. The FDM/SDM lithography generates multiple electromagnetic waves from received electromagnetic energy by controlling at least one parameter of each of the electromagnetic waves to be different among each of the electromagnetic waves, at block 802. The FDM/SDM lithography forms multiple light patterns by directing each of the generated electromagnetic waves at each of a pre-specified number of feature masks, at block 804. Each of the generated light patterns is directed toward a substrate, at block 806. A surface of the substrate is at least partially covered with the photoresist material and an R-CEM.

As an example, the FDM/SDM lithography multiplexes various circuit features of an original mask through the use of multiple exposures of a substrate using multiple masks, as described above with reference to FIGS. 2 and 3. More specifically the FDM/SDM lithography multiplexes the circuit features or pattern of the original mask through which the substrate is illuminated by dividing the circuit features of the original mask among a number "N" of separate masks in the spatial domain. Each of the N masks therefore includes one or more features of the original mask, and the set of N masks collectively includes all features of the original mask. The division of features of the original mask in the spatial domain may be based on feature size, feature shape, feature dimensions, feature geometry, mask size, mask, shape, mask geometry, and physical proximity of the features, to name a few, but is not so limited.

In addition, the FDM/SDM lithography uses different properties of light to further divide the mask features of each mask in the frequency domain. Thus, each of the N masks of an embodiment is configured in accordance with the multiple light beams with which the masks are illuminated so that the appropriate mask features are projected onto the substrate when the mask is illuminated with each of a number of light beams having pre-specified properties, as described above with reference to FIGS. 4, 5A, and 5B.

The FDM/SDM lithography multiplexes various features of each mask in the frequency domain through the use of multiple exposures through each mask, where each exposure uses a different one of multiple light beams or electromagnetic waves. Each of the multiple light beams includes at least one property or parameter that is different or varied from that of the other light beams. In providing the different light beams or electromagnetic waves for each exposure the FDM/SDM lithography controls various properties of the light, where the properties include at least one of polarization, frequency, phase, modulation, irradiance, illumination axis, focus position, and exposure dosage, but the embodiment is not so limited. Additionally, the FDM/SDM lithography multiplexes various features of each mask in the spatial domain through the use of one exposure through each mask using one of the multiple light beams.

The FDM lithography systems and methods provided herein include a method of generating an image comprising at least one of generating a plurality of light beams from a light source by controlling at least one parameter of the light source to be different among each of the plurality of light beams and forming a plurality of light patterns of circuit structures separated in frequency by directing each of the plurality of light beams at a mask of circuit features.

The method of an embodiment further comprises directing each of the plurality of light patterns toward a silicon substrate, the silicon substrate including a silicon wafer having a surface at least partially covered with at least one of a photoresist material and a reversible contrast enhancement material (R-CEM). Directing may further comprise providing a plurality of exposures of the silicon substrate separated in time by directing each of the plurality of light patterns toward the silicon substrate at a different time.

The at least one parameter of an embodiment includes at least one of polarization, frequency, phase, Modulation, irradiance, illumination axis, focus position, exposure time, and exposure dosage.

The method of an embodiment further comprises collimating each of the plurality of light patterns.

The circuit features of an embodiment form a plurality of sets of circuit features, wherein the mask is configured in accordance with the plurality of light beams so that a corresponding one of the plurality of sets of circuit features are included in a corresponding one of the plurality of light patterns when the mask is illuminated with a corresponding one of the plurality of light beams.

The formation of the plurality of light patterns of an embodiment further comprises directing each of the plurality of light beams towards at least one additional mask of circuit features. Directing each of the plurality of light beams towards the at least one additional mask of an embodiment generates a second plurality of light patterns that include circuit structures separated in a spatial domain.

The FDM lithography systems and methods provided herein include a method of producing an image in a photoresist material comprising at least one of generating a plurality of electromagnetic waves from received electromagnetic energy by controlling at least one parameter of each of the plurality of electromagnetic waves to be different among each of the plurality of electromagnetic waves, forming a plurality of light patterns by directing each of the plurality of electromagnetic waves at a feature mask, and directing each of the plurality of light patterns toward a substrate that includes a surface at least partially covered with the photoresist material and a reversible contrast enhancement material (R-CEM).

The directing of an embodiment further comprises providing a plurality of exposures of the photoresist material separated in time by directing each of the plurality of light patterns toward the substrate at a different time. The method of an embodiment further comprises selecting a time interval for the separation between each of the plurality of exposures, wherein the time interval allows the R-CEM to relax between at least two of the plurality of exposures.

The formation of the plurality of light patterns of an embodiment comprises forming a plurality of different exposure patterns separated in frequency.

The method of an embodiment further comprises collimating each of the plurality of light patterns.

The at least one parameter of an embodiment includes at least one of polarization, frequency, phase, modulation, irradiance, illumination axis, focus position, exposure time, and exposure dosage.

The feature mask of an embodiment includes a plurality of sets of circuit features, wherein the feature mask is configured in accordance with the plurality of electromagnetic waves so that a corresponding one of the plurality of sets of circuit features are transferred in a corresponding one of the plurality of light patterns when the feature mask is illuminated with a corresponding one of the plurality of electromagnetic waves.

The formation of the plurality of light patterns of an embodiment further comprises directing each of the plurality of electromagnetic waves towards at least one additional feature mask. Directing each of the plurality of electromagnetic waves towards the at least one additional feature mask of an embodiment generates a second plurality of light patterns that include circuit structures separated in a spatial domain.

The electromagnetic energy of an embodiment is in a spectrum that extends from approximately an ultraviolet region to an infrared region of an electromagnetic spectrum.

The FDM lithography systems and methods provided herein include a lithography system comprising at least one of a condenser that receives electromagnetic energy from a source and generates a plurality of electromagnetic waves that each have different properties by controlling at least one property of the electromagnetic energy to be different among each of the plurality of electromagnetic waves, a mask positioned to receive the plurality of electromagnetic waves, the mask including a plurality of circuit features from which a plurality of light patterns are generated, and a projector positioned to receive the plurality of light patterns and direct the plurality of light patterns toward a silicon device, the silicon device including a surface at least partially covered with a reversible contrast enhancement material (R-CEM).

The condenser of the system of an embodiment generates the plurality of electromagnetic waves so that each of the plurality of light patterns are separated by at least one time period, wherein the plurality of light patterns result in a plurality of exposures of the silicon device. The at least one period of time of an embodiment allows the R-CEM to relax between at least two of the plurality of exposures.

The formation of the plurality of light patterns of the system of an embodiment comprises forming a plurality of different exposure patterns separated in frequency.

The projector of the system of an embodiment collimates each of the plurality of light patterns.

The at least one property of the electromagnetic energy of the system of an embodiment includes at least one of polarization, frequency, phase, modulation, irradiance, illumination axis, focus position, exposure time, and exposure dosage.

The mask of the system of an embodiment is configured in accordance with the plurality of electromagnetic waves so that corresponding ones of the plurality of circuit features are transferred in a corresponding one of the plurality of light patterns when the mask is illuminated with a corresponding one of the plurality of electromagnetic waves.

The system of an embodiment further comprises at least one additional mask positioned to receive the plurality of electromagnetic waves, wherein directing each of the plurality of electromagnetic waves towards the at least one additional mask generates a second plurality of light patterns that include circuit structures separated in a spatial domain.

The electromagnetic energy of the system of an embodiment is in a spectrum that extends from approximately an ultraviolet region to an infrared region of an electromagnetic spectrum.

The FDM lithography systems and methods provided herein include a device comprising at least one of means for generating a plurality of light beams from a light source by controlling at least one parameter of the light source to be different among each of the plurality of light beams and means for forming a plurality of light patterns of circuit structures separated in frequency by directing each of the plurality of light beams at a mask of circuit features.

The device of an embodiment further comprises means for directing each of the plurality of light patterns toward a silicon substrate.

The device of an embodiment further comprises means for collimating each of the plurality of light patterns.

The at least one parameter of the device of an embodiment includes at least one of polarization, frequency, phase, modulation, irradiance, illumination axis, focus position, exposure time, and exposure dosage.

The silicon substrate of the device of an embodiment includes a silicon wafer having a surface at least partially covered with at least one of a photoresist material and a reversible contrast enhancement material (R-CEM).

The FDM lithography systems and methods provided herein include a system for exposing a wafer, comprising at least one of means for generating a plurality of electromagnetic waves from received electromagnetic energy by controlling at least one property of each of the plurality of electromagnetic waves to be different among each of the plurality of electromagnetic waves, means for forming a plurality of light patterns by directing each of the plurality of electromagnetic waves at a feature mask, and means for directing each of the plurality of light patterns toward a the wafer, the wafer including a substrate at least partially covered with the photoresist material and a reversible contrast enhancement material (R-CEM).

The means for directing in the system of an embodiment further comprises means for providing a plurality of exposures of the photoresist material separated in time by directing each of the plurality of light patterns toward the substrate at a different time. The system of an embodiment further comprises means for controlling a time interval for the separation between each of the plurality of exposures, wherein the time interval allows the R-CEM to relax between at least two of the plurality of exposures.

The means for forming the plurality of light patterns in the system of an embodiment comprises means for forming a plurality of different exposure patterns separated in frequency.

The system of an embodiment further comprises means for collimating each of the plurality of light patterns.

The at least one property of the system of an embodiment includes at least one of polarization, frequency, phase, modulation, irradiance, illumination axis, focus position, exposure time, and exposure dosage.

The FDM lithography systems and methods provided herein include a machine-readable medium including executable instructions which when executed by a processor-based system produces an image in a material by at least one of generating a plurality of electromagnetic waves from received electromagnetic energy by controlling at least one parameter of each of the plurality of electromagnetic waves to be different among each of the plurality of electromagnetic waves, forming a plurality of light patterns by directing each of the plurality of electromagnetic waves at a feature mask, and directing each of the plurality of light patterns toward the material, the material including a silicon substrate at least partially covered with the photoresist material and a reversible contrast enhancement material R-CEM).

Aspects of the FDM lithography systems described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the FDM lithography system include: microcontrollers with memory (such as electronically erasable programmable read only memory (EEPROM)), embedded microprocessors, firmware, software, etc. Furthermore, aspects of the FDM lithography system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs including, without limitation, net-list generation programs, place and route programs and the like.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the FDM lithography systems and methods is not intended to be exhaustive or to limit the FDM lithography systems and methods to the precise form disclosed. While specific embodiments of, and examples for, the FDM lithography systems and methods are described herein for illustrative purposes, various equivalent modifications are possible within the scope of the FDM lithography systems and methods, as those skilled in the relevant art will recognize. The teachings of the FDM lithography systems and methods provided herein can be applied to other processing systems and methods, not only for the FDM lithography systems and methods described above.

The elements and acts of the various embodiments described above can be combined to provide further embodiments. These and other changes can be made to the FDM lithography systems and methods in light of the above detailed description.

In general, in the following claims, the terms used should not be construed to limit the FDM lithography systems and methods to the specific embodiments disclosed in the specification and the claims, but should be construed to include all systems and methods that operate under the claims. Accordingly, the FDM lithography systems and methods are not limited by the disclosure, but instead the scope of the FDM lithography systems and methods are to be determined entirely by the claims.

While certain aspects of the FDM lithography systems and methods are presented below in certain claim forms, the inventor contemplates the various aspects of the FDM lithography systems and methods in any number of claim forms. For example, while only one aspect of the system is recited as embodied in machine-readable medium, other aspects may likewise be embodied in machine-readable medium. Accordingly, the inventor reserves the right to add additional claims after filing the application to pursue such additional claim forms for other aspects of the FDM lithography systems and methods.

What is claimed is:

1. A non-transitory computer-readable medium including executable instructions which when executed by a processor-based system generates an image onto a substrate by:
    generating a plurality of electromagnetic waves, wherein each electromagnetic wave has at least one property of light in a frequency domain that is different from properties of others in the plurality of electromagnetic waves;
    exposing a feature mask of the image to the plurality of electromagnetic waves resulting in a plurality of light patterns being formed, wherein the feature mask has a plurality of mask feature sets comprising features that only respond to a specific property of light in the frequency domain, and wherein the plurality of light patterns form a light pattern of the image; and projecting the plurality of light patterns towards a substrate that includes a surface at least partially covered with a photoresist material and a reversible contrast enhancement material (R-CEM).

2. A non-transitory computer-readable medium including executable instructions which when executed by a processor-based system models an image on a substrate by:

creating a first mask dataset having a plurality of mask feature sets, wherein each of the mask feature sets comprises features that only respond to a specific property of light in a frequency domain, wherein when exposed to a plurality of light beams the plurality of mask feature sets results in a plurality of light patterns being formed, and wherein the plurality of light patterns form a light pattern of the image;

modeling exposure of the first mask dataset to the plurality of light beams resulting in a light pattern being formed, wherein each of the light beams has at least one property of light in a frequency domain that is different from properties of others in the plurality of light beams and that corresponds to one of the mask feature sets; and modeling projection of the light pattern onto the substrate.

3. The non-transitory computer-readable medium of claim 2, wherein the processor-based system models the image on the substrate by further modeling the directing of each of the plurality of light patterns toward a silicon substrate, the silicon substrate including a silicon wafer having a surface at least partially covered with at least one of a photoresist material and a reversible contrast enhancement material (R-CEM).

4. The non-transitory computer-readable medium of claim 3, wherein the modeling the directing of light further comprises providing a plurality of exposures of the silicon substrate separated in time by directing each of the plurality of light patterns toward the silicon substrate at a different time.

5. The non-transitory computer-readable medium of claim 2, wherein the property of light includes at least one of polarization, frequency, phase, modulation, irradiance, illumination axis, focus position, exposure time, and exposure dosage.

6. The non-transitory computer-readable medium of claim 2, wherein the processor-based system models the image on the substrate by further modeling the collimation of each of the plurality of light patterns.

7. The non-transitory computer-readable medium of claim 2, wherein the mask is configured in accordance with the plurality of light beams so that a corresponding one of the mask feature sets are included in a corresponding one of the plurality of light patterns when the mask is illuminated with a corresponding one of the plurality of light beams.

8. The non-transitory computer-readable medium of claim 2, wherein the formation of the plurality of light patterns further comprises directing each of the plurality of light beams towards at least one additional mask feature set.

9. The non-transitory computer-readable medium of claim 8, wherein the directing each of the plurality of light beams towards the at least one additional mask feature set generates a second plurality of light patterns that include circuit structures separated in a spatial domain.

10. A processor-based system for modeling an image on a substrate, comprising:

a processor;
a memory connected to the processor; and
a non-transitory computer-readable medium including executable instructions which when executed by the processor models the image on the substrate by:

creating a first mask dataset having a plurality of mask feature sets, wherein each of the mask feature sets comprises features that only respond to a specific property of light in a frequency domain, wherein when exposed to a plurality of light beams the plurality of mask feature sets results in a plurality of light patterns being formed, and wherein the plurality of light patterns form a light pattern of the image;

modeling exposure of the first mask dataset to the plurality of light beams resulting in a light pattern being formed, wherein each of the light beams has at least one property of light in a frequency domain that is different from properties of others in the plurality of light beams and that corresponds to one of the mask feature sets; and modeling projection of the light pattern onto the substrate.

11. The processor-based system of claim 10, wherein the processor models the image on the substrate by further modeling the directing of each of the plurality of light patterns toward a silicon substrate, the silicon substrate including a silicon wafer having a surface at least partially covered with at least one of a photoresist material and a reversible contrast enhancement material (R-CEM).

12. The processor-based system of claim 11, the modeling the directing of light further comprises providing a plurality of exposures of the silicon substrate separated in time by directing each of the plurality of light patterns toward the silicon substrate at a different time.

13. The processor-based system of claim 10, wherein the property of light includes at least one of polarization, frequency, phase, modulation, irradiance, illumination axis, focus position, exposure time, and exposure dosage.

14. The processor-based system of claim 10, wherein the processor models the image on the substrate by further modeling the collimation of each of the plurality of light patterns.

15. The processor-based system of claim 10, wherein the mask is configured in accordance with the plurality of light beams so that a corresponding one of the mask feature sets is included in a corresponding one of the plurality of light patterns when the mask is illuminated with a corresponding one of the plurality of light beams.

16. The processor-based system of claim 10, wherein the formation of the plurality of light patterns further comprises the processor directing each of the plurality of light beams towards at least one additional mask feature set.

17. The processor-based system of claim 16, wherein the directing each of the plurality of light beams towards the at least one additional mask feature set generates a second plurality of light patterns that include circuit structures separated in a spatial domain.

* * * * *